(12) United States Patent
Sung

(10) Patent No.: US 10,381,272 B1
(45) Date of Patent: Aug. 13, 2019

(54) TECHNIQUES FOR FORMING MULTIPLE WORK FUNCTION NANOSHEET DEVICE

(71) Applicant: Varian Semiconductor Equipment Associates, Inc., Gloucester, MA (US)

(72) Inventor: Min Gyu Sung, Essex, MA (US)

(73) Assignee: VARIAN SEMICONDUCTOR EQUIPMENT ASSOCIATES, INC, Gloucester, MA (US)

( * ) Notice: Subject to any disclaimer, the term of this patent is extended or adjusted under 35 U.S.C. 154(b) by 0 days.

(21) Appl. No.: 16/003,969

(22) Filed: Jun. 8, 2018

(51) Int. Cl.
| | | |
|---|---|---|
| H01L 21/8238 | (2006.01) | |
| H01L 21/8234 | (2006.01) | |
| H01L 21/02 | (2006.01) | |
| H01L 21/28 | (2006.01) | |
| H01L 21/3213 | (2006.01) | |
| H01L 29/786 | (2006.01) | |
| H01L 27/092 | (2006.01) | |
| H01L 29/06 | (2006.01) | |

(Continued)

(52) U.S. Cl.
CPC ........ H01L 21/823842 (2013.01); H01L 21/02532 (2013.01); H01L 21/02603 (2013.01); H01L 21/28088 (2013.01); H01L 21/32136 (2013.01); H01L 21/32139 (2013.01); H01L 21/823412 (2013.01); H01L 27/092 (2013.01); H01L 29/0673 (2013.01); H01L 29/42392 (2013.01); H01L 29/4908 (2013.01); H01L 29/78651 (2013.01); H01L 29/78696 (2013.01)

(58) Field of Classification Search
CPC ....... H01L 21/823842; H01L 21/32139; H01L 21/32136; H01L 21/28088; H01L 21/02532; H01L 21/02603; H01L 21/823412; H01L 27/092; H01L 29/4908; H01L 29/42392; H01L 29/0673; H01L 29/78651; H01L 29/78696
See application file for complete search history.

(56) References Cited

U.S. PATENT DOCUMENTS 9,947,804 B1 * 4/2018 Frougier ........... H01L 29/78696
2010/0038721 A1 * 2/2010 Lin ................... H01L 21/28088
257/369

(Continued)

OTHER PUBLICATIONS

Loubet, et al., "Stacked Nanosheet Gate-All-Around Transistor to Enable Scaling Beyond FinFET," 2017 Symposium on VLSI Technology Digest of Technical Papers, T230-T231, 2017 JSAP.

Primary Examiner — Allan R Wilson

(57) ABSTRACT

A method of forming a three-dimensional transistor device may include performing a first blanket deposition of a first work function metal over a first nanowire stack, having a first polarity, and over a second nanowire stack having a second polarity, in a complementary metal oxide semiconductor (CMOS) nanosheet device structure, disposed on a substrate. The method may include directing angled oxygen ions at the CMOS nanosheet device structure. As a result an oxide may be formed in the first work function metal along a top region of the first nanowire stack and the second nanowire stack, while an oxide is not formed in the first work function metal at a bottom of a trench between the first nanowire stack and the second nanowire stack. The method may include performing a vertical etch to selectively remove the first work function metal between the first nanowire stack and the second nanowire stack.

19 Claims, 8 Drawing Sheets

(51) Int. Cl.
*H01L 29/423* (2006.01)
*H01L 29/49* (2006.01)

(56) References Cited

U.S. PATENT DOCUMENTS

2016/0027929 A1* 1/2016 Cheng ............... H01L 29/78696
                                                          257/9
2017/0186846 A1* 6/2017 Badaroglu ........ H01L 21/02507
2017/0222024 A1* 8/2017 Bergendahl ....... H01L 29/66742

* cited by examiner

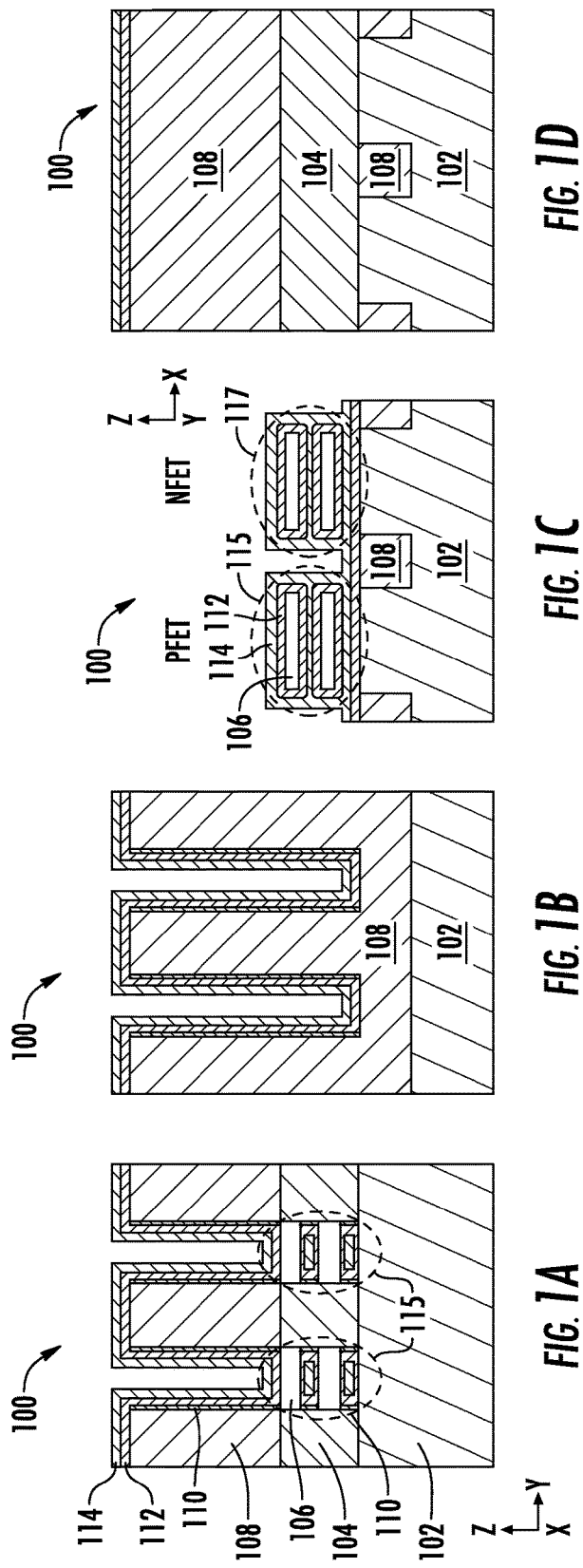

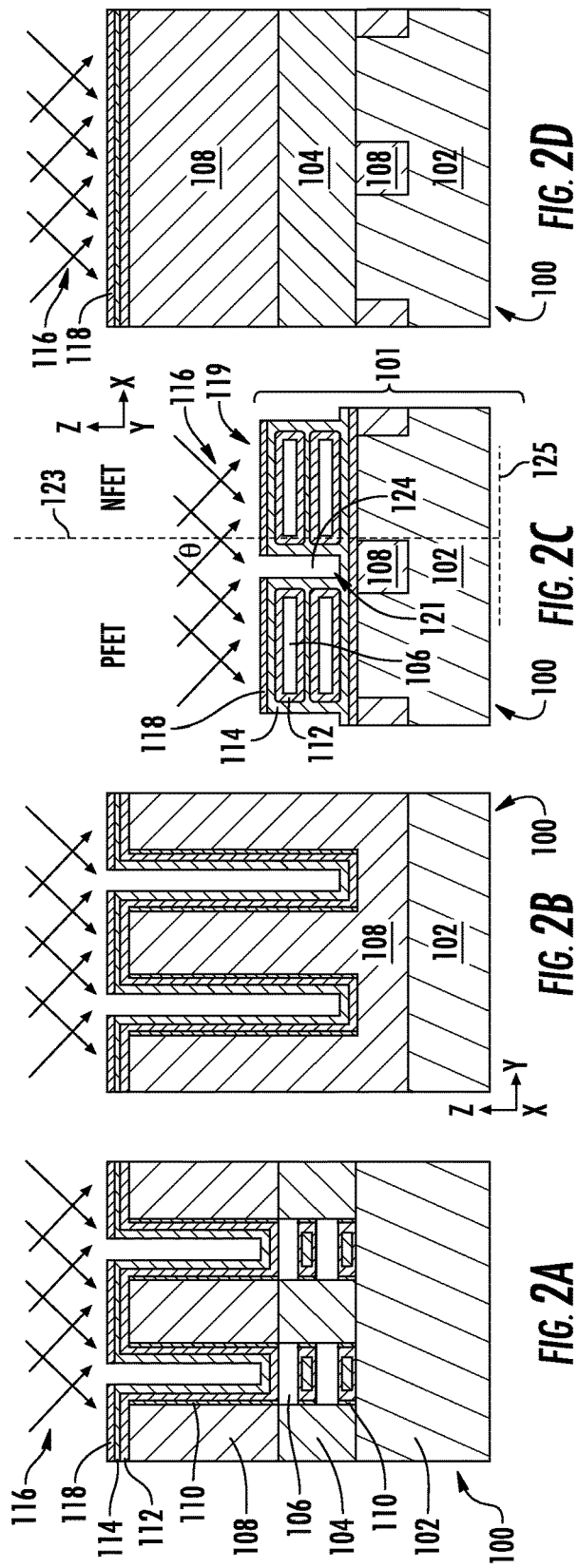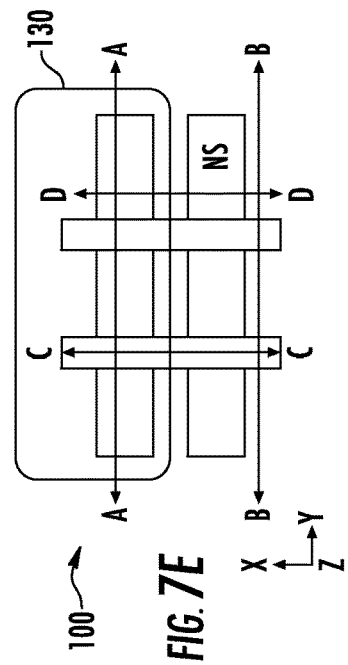

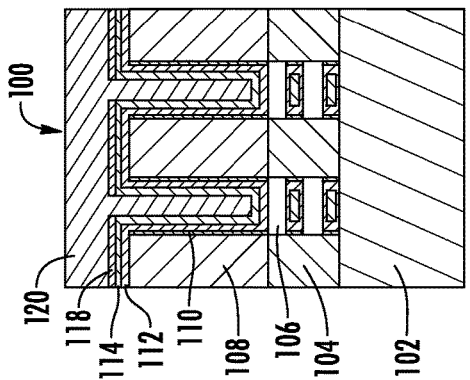
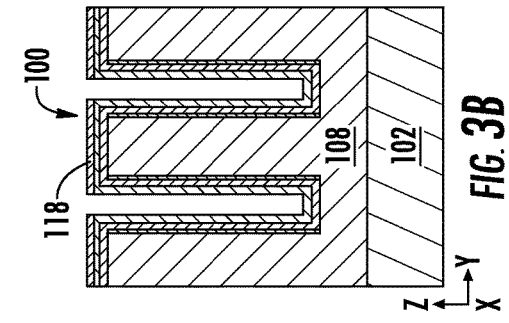
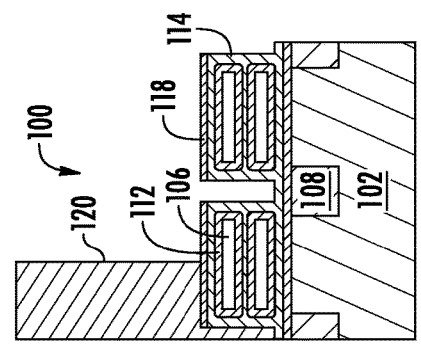
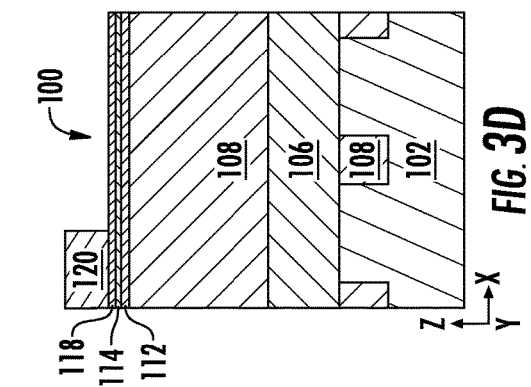
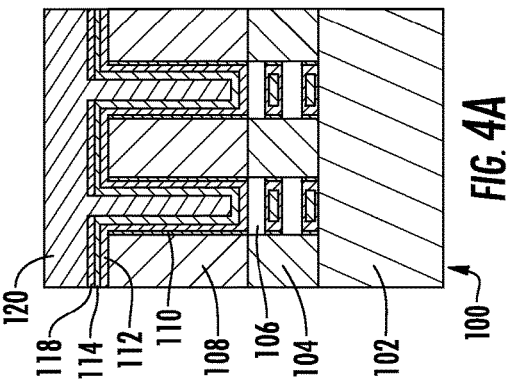
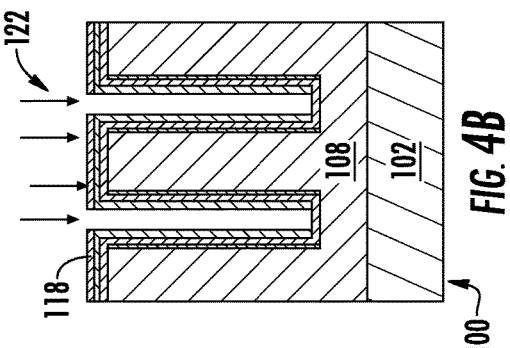
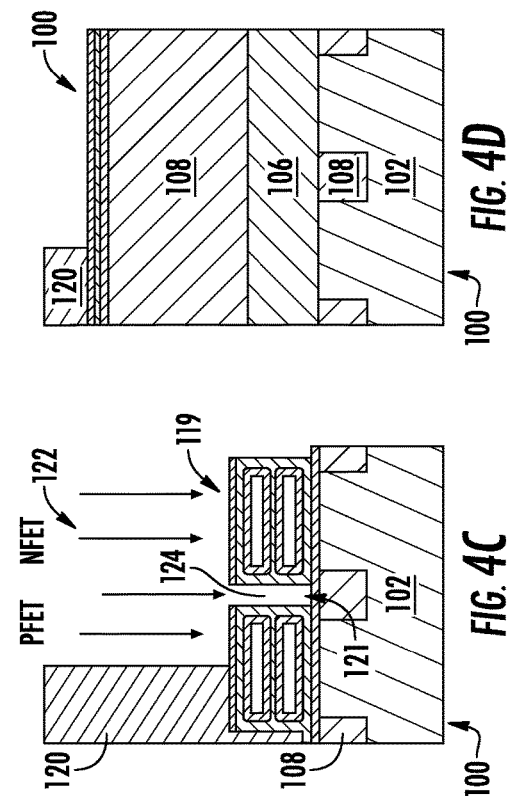

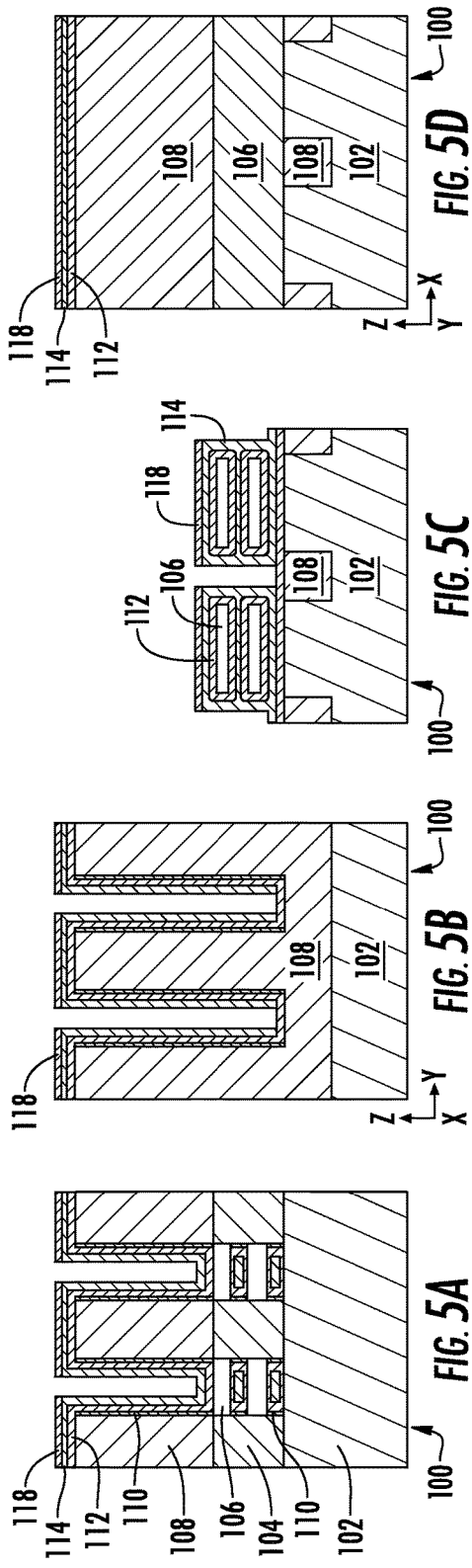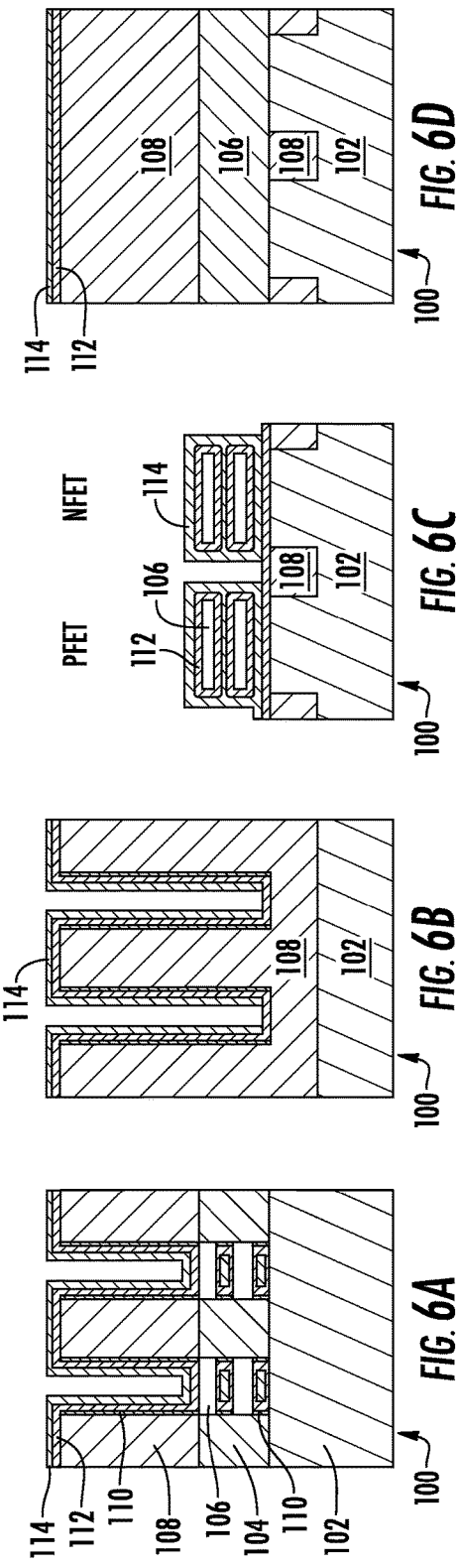

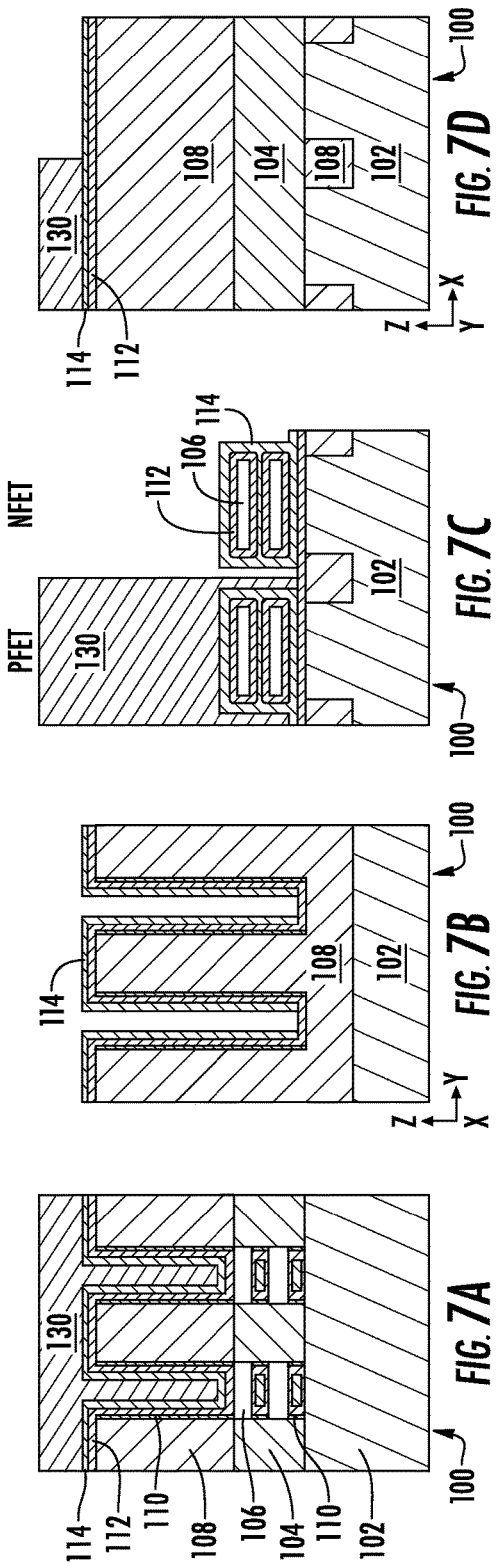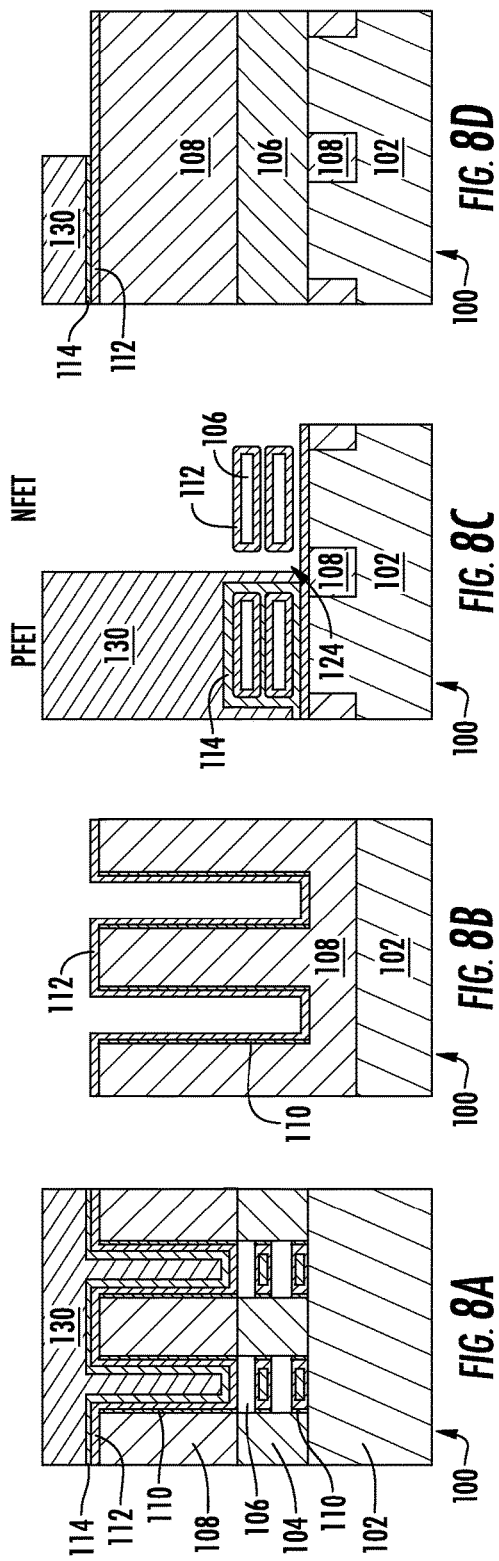

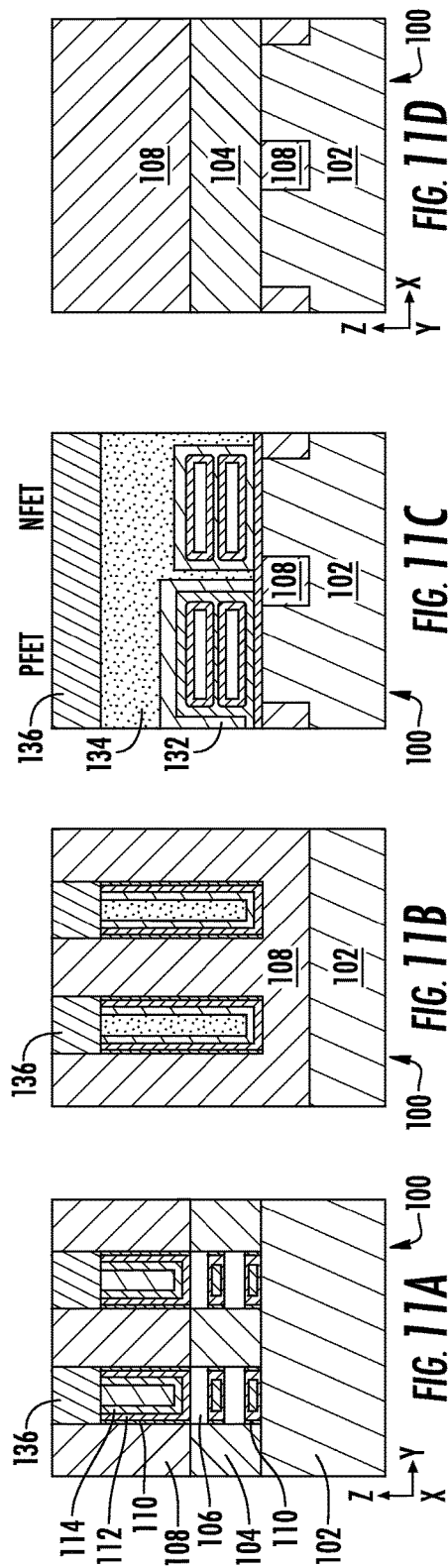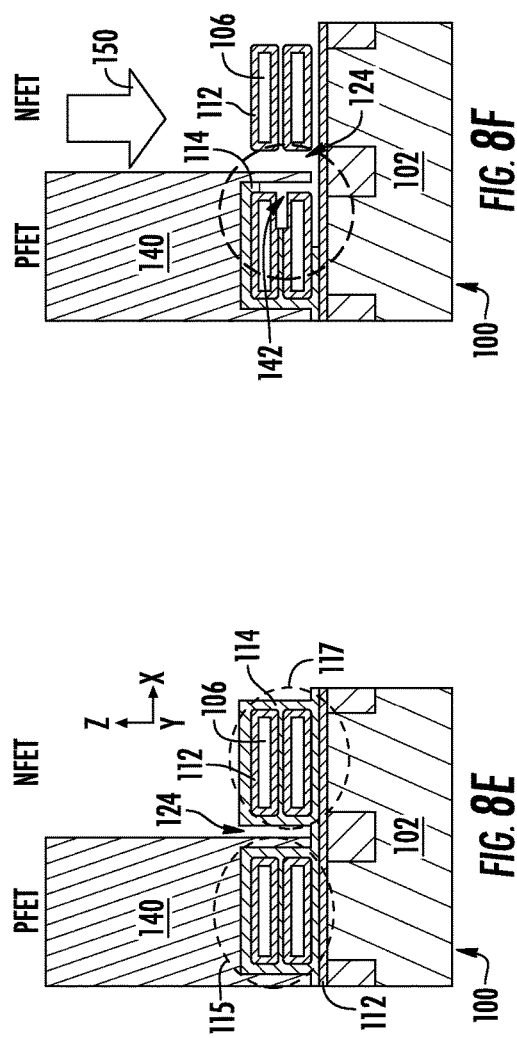

TECHNIQUES FOR FORMING MULTIPLE WORK FUNCTION NANOSHEET DEVICE

FIELD

The present embodiments relate to semiconductor device structures, and more particularly, to structures and processing for three dimensional transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), or horizontal gate all around (HGAA) transistor devices involves challenging processing issues. HGAA structures are often referred to as a nanosheet device because the HGAA transistor formation entails formation of multilayers of nanometer-thick sheets of two different semiconductor materials grown in an epitaxial heterostructure, such as a stack of alternating silicon and silicon:germanium alloy (SiGe) layers, arranged in a vertical configuration.

To form complementary metal oxide semiconductor (CMOS) devices, in many approaches the p-type FET (PFET) device is formed with a gate having a first work function metal, while the n-type FET (NFET) is formed with a gate having a second work function metal. This approach may entail formation of the first work function metal across the whole device, while the first work function metal is subsequently selectively removed from the NFET portion of a CMOS device, to be replaced with the appropriate, second work function metal on NFET gates. For nanosheet devices, operable techniques do not exist for selectively removing the first work function metal from NFET regions while not damaging PFET regions.

With respect to these and other considerations, the present disclosure is provided.

BRIEF SUMMARY

In an embodiment a method of forming a three-dimensional transistor device is provided. The method may include performing a first blanket deposition of a first work function metal over a first nanowire stack, having a first polarity, and over a second nanowire stack having a second polarity, in a complementary metal oxide semiconductor (CMOS) nanosheet device structure, disposed on a substrate. The method may also include directing angled oxygen ions at the CMOS nanosheet device structure. As a result an oxide may be formed in the first work function metal along a top region of the first nanowire stack and the second nanowire stack, while an oxide is not formed in the first work function metal at a bottom of a trench between the first nanowire stack and the second nanowire stack. The method may further include performing a vertical etch to selectively remove the first work function metal between the first nanowire stack and the second nanowire stack.

In a further embodiment, a method of forming a three-dimensional transistor device, may include performing a first blanket deposition of a P-type work function metal over a P-type nanowire stack and over an N-type nanowire stack, in a complementary metal oxide semiconductor (CMOS) nanosheet device structure, disposed on a substrate. The method may include directing angled oxygen ions at the CMOS nanosheet device structure. As such, an oxide may be formed in the P-type work function metal along a top region of the P-type nanowire stack and the N-type nanowire stack, while an oxide is not formed in the P-type work function metal at a bottom of a trench between the P-type nanowire stack and the P-type nanowire stack. The method may also include performing a vertical etch to remove the P-type work function metal between the P-type nanowire stack and the N-type nanowire stack, while not removing the P-type work function metal above the P-type nanowire stack and the N-type nanowire stack.

In another embodiment, a method of forming a three-dimensional transistor device is provided. The method may include directing angled oxygen ions at a CMOS nanosheet device structure, where the CMOS device structure includes a titanium nitride layer disposed over a P-type nanowire stack and over an N-type nanowire stack. As such, titanium oxide may be formed in the titanium nitride layer along a top region of the N-type nanowire stack and the P-type nanowire stack, while titanium oxide is not formed in the titanium nitride layer at a bottom of a trench between the P-type nanowire stack and the P-type nanowire stack. The method may include performing a first block patterning operation to expose N-type regions in the CMOS nanosheet device structure. The method may also include performing a vertical etch to selectively remove the titanium nitride layer between the P-type nanowire stack and the N-type nanowire stack, wherein the titanium oxide is not removed along the top region.

BRIEF DESCRIPTION OF THE DRAWINGS

FIG. 1A to FIG. 1D depict side different cross-sectional views of a semiconductor device structure, at one stage of fabrication, according to embodiments of the disclosure;

FIG. 1E depicts a top plan view of one embodiment of the device structure of FIGS. 1A-1D, with various details omitted, illustrating the location of the cross-sectional views of FIG. 1A to FIG. 1D;

FIG. 2A to FIG. 2D depict respective side cross-sectional views of the semiconductor device structure of FIG. 1A to FIG. 1D, at another stage of fabrication;

FIG. 3A to FIG. 3D depict respective side cross-sectional views of the semiconductor device structure of FIG. 1A to FIG. 1D, at another stage of fabrication;

FIG. 3E depicts a top plan view of one embodiment of the device structure of FIGS. 3A-3D, with various details omitted, illustrating the location of the cross-sectional views of FIG. 3A to FIG. 3D;

FIG. 4A to FIG. 4D depict respective side cross-sectional views of the semiconductor device structure of FIG. 1A to FIG. 1D, at another stage of fabrication;

FIG. 5A to FIG. 5D depict respective side cross-sectional views of the semiconductor device structure of FIG. 1A to FIG. 1D, at another stage of fabrication;

FIG. 6A to FIG. 6D depict respective side cross-sectional views of the semiconductor device structure of FIG. 1A to FIG. 1D, at another stage of fabrication;

FIG. 7A to FIG. 7D depict respective side cross-sectional views of the semiconductor device structure of FIG. 1A to FIG. 1D, at another stage of fabrication;

FIG. 7E depicts a top plan view of one embodiment of the device structure of FIGS. 7A-7D, with various details omitted, illustrating the location of the cross-sectional views of FIG. 7A to FIG. 7D;

FIG. 8A to FIG. 8D depict respective side cross-sectional views of the semiconductor device structure of FIG. 1A to FIG. 1D, at another stage of fabrication;

FIG. 8E to FIG. 8F depict side cross-sectional views of a reference fabrication operation, corresponding to the operation stage of FIGS. 8A-8D;

FIG. 11A to FIG. 11D depict respective side cross-sectional views of the semiconductor device structure of FIG. 1A to FIG. 1D, at another stage of fabrication.

DETAILED DESCRIPTION

Figure 9A:
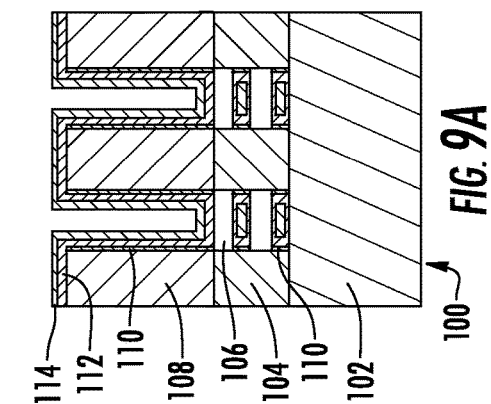
FIG. 9A to FIG. 9D depict respective side cross-sectional views of the semiconductor device structure of FIG. 1A to FIG. 1D, at another stage of fabrication.
Figure 9B:
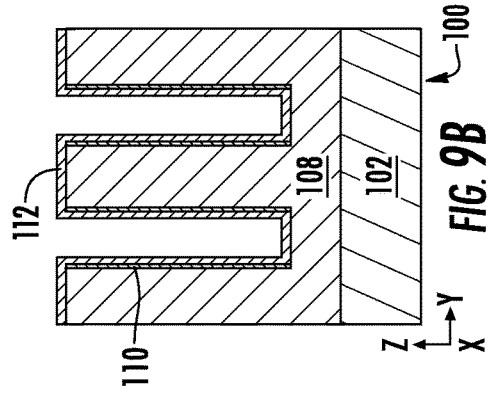
Figure 9C:
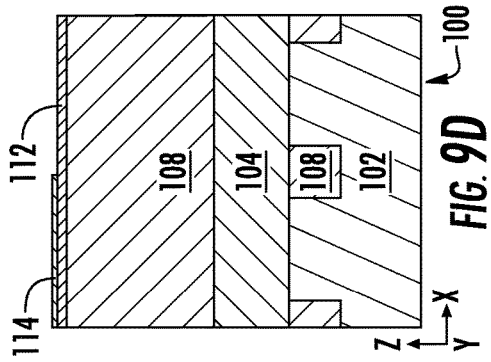
Figure 9D:
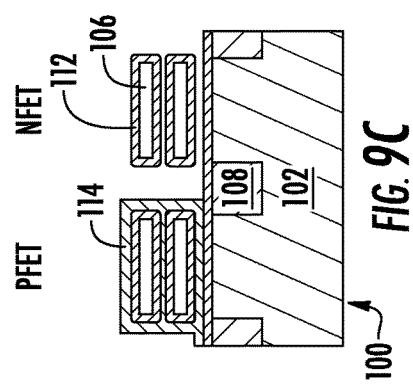

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form semiconductor devices, including three-dimensional transistors, formed in a semiconductor substrate. As is known, three dimensional transistors, such as HGAA transistors, may be arranged in circuitry to form various types of logic devices, as well as memory devices. An HGAA structure implemented in a CMOS architecture may be referred to herein as a "CMOS nanosheet device" where the CMOS nanosheet device includes both NFET and PFET transistor regions, arranged in stacks of semiconductor nanowires. Such stacks may be referred to herein as nanowire stacks, where a nanowire stack of a first polarity may be a P-type nanowire stack, and a nanowire stack of a second polarity may be an N-type nanowire stack.

Turning now to FIG. 1A to FIG. 1D there are shown different side cross-sectional views of a semiconductor device structure 100, at one stage of fabrication, according to embodiments of the disclosure. FIG. 1E depicts a top plan view of one embodiment of the device structure of FIGS. 1A-1D, with various details omitted, illustrating the location of the cross-sectional views of FIG. 1A to FIG. 1D. The cut along the A-A section of FIG. 1A illustrates the structure of the semiconductor device structure 100 along an active P-type region, intersecting two adjacent gate regions. The cut along the B-B section of FIG. 1B is parallel to the A-A cut, while located off the active regions, along isolation structures. The cut along the C-C section of FIG. 1C is located along a gate structure, orthogonal to the A-A cut, intersecting two different active regions, a PFET region, and an NFET region, as shown. The cut along the D-D section is parallel to the C-C section and intersects two active regions, while not along a gate. The same convention shown in FIG. 1E as described with respect to FIGS. 1A-1D also applies to the various views of the respective FIGS. 2A-2D, 3A-3D, . . . 11A-11D to follow.

At the instance of FIG. 1A the device structure represents an intermediate stage of formation of a CMOS nanosheet device, generally fabricated according to known approaches. In FIG. 1A, the semiconductor device structure 100 has been fabricated to the point where nanowire structures have been formed and coated with a gate insulator and work function metal. As detailed below, because the semiconductor device structure 100 is to form a CMOS device, the work function metal coating the structures in FIG. 1A may be preserved in the appropriate devices having the polarity suited to the work function metal. Different portions of the same work function metal may be removed from other devices having the opposite polarity in subsequent operations. As shown in FIG. 1A, the semiconductor device structure 100 includes a semiconductor base 102, which base may be monocrystalline, such as monocrystalline silicon. The semiconductor device structure 100 further includes a first nanowire stack 115 of a first polarity and a second nanowire stack 117 of a second polarity (see FIG. 1C). The first nanowire stack 115 and the second nanowire stack 117 may include a plurality of nanowires, shown as nanowires 106, which nanowires may be monocrystalline silicon as in known devices. In the example of FIG. 1E and FIG. 1C, the PFET region may represent the top active region shown and the left active region shown, respectively. A difference between nanowires of the first nanowire stack 115 and the second nanowire stack 117 may thus be in the polarity of the doping of the nanowire. The semiconductor device structure 100 may further include a source/drain region 104, such as an epitaxially grown semiconductor. The source/drain region 104 in the PFET region (shown in FIG. 1A) will also vary in polarity from a source/drain region 104 of the NFET region (not shown in the figures). The semiconductor device structure 100 further includes insulator regions 108, arranged as shown, which regions may be oxide according to various embodiments.

The semiconductor device structure 100 may also include a silicon nitride liner 110, a gate dielectric 112, and a first work function metal 114. In the example shown, the first work function metal 114 may be assumed to be a P-type work function metal (also referred to as "PFET work function metal"). In particular embodiments, the first work function metal 114 may be TiN, suitable for use in transistor gates of P-type transistors. As shown in FIG. 1C, the first work function metal 114 may extend around the nanowires 106 in the NFET region. Notably, practical work function metal deposition processes may generate blanket deposition of a metal, covering the device structures of both NFET regions (n-type regions) and PFET regions (p-type regions). Thus, the second nanowire stack 117, for use in NFET transistors, may unavoidably be coated with a work function metal appropriate for PFETS, while not appropriate for NFETs.

Turning to FIGS. 2A-2D, there is shown a subsequent instance where angled oxygen ions 116 are directed to the CMOS nanosheet device structure of FIGS. 1A-1D. As such, an oxide layer 118 is formed in the first work function metal 114 along a top region 119 of the first nanowire stack 115 and the second nanowire stack 117, and wherein an oxide layer 118 is not formed in the first work function metal at a bottom 121 of a trench 124 between the first nanowire stack 115 and the second nanowire stack 117.

As noted, the first work function metal 114 may be TiN, where exposure to oxygen ions may form the oxide layer 118 as titanium dioxide. Advantageously, as discussed further below, titanium nitride metal may be selectively etched with respect to titanium dioxide. As shown in FIG. 2C, the angled oxygen ions 116 may form a non-zero angle of incidence ($\theta$) with respect to a perpendicular 123 to a plane 125 of the substrate. In various embodiments a value of the non-zero angle of incidence may range between 10 degrees and 80 degrees. In some embodiments of dose of the angled oxygen ions 116 may range from $1E16/cm^2$ to $2E17/cm^2$. The embodiments are not limited in this context. In some embodiments, an energy of the angled oxygen ions may be 2 keV or less, such as 1 keV. The embodiments are not limited in this context. Such a dose may and ion energy may be suitable to form an oxide layer having an appropriate thickness. For example, in various non-limiting embodiments, the thickness of the oxide layer 118 may range from 1 nm to 4 nm.

Depending upon the aspect ratio of the trench 124, meaning the ratio of trench height along the Z-axis (of the Cartesian coordinate system shown) to trench width along the Y-axis, the value of the non-zero angle of incidence may be adjusted to ensure angled oxygen ions 116 do not strike the bottom 121 of trench 124. In this manner, the first work function metal 114 may remain intact and unoxidized at the bottom 121 of trench 124 as well as at the bottom of trenches of FIG. 2A and FIG. 2B, while the top region 119 is impacted by the angled oxygen ions 116 and is transformed at least in part into the oxide layer 118.

According to some embodiments, the angled oxygen ions 116 may be provided using a known beamline ion implanter, where the substrate 101 containing the semiconductor device structure 100 is tilted with respect to an oxygen-containing ion beam. The substrate 101 may be tilted in different exposures to provide angled oxygen ions 116 from opposite directions, as suggested in FIG. 2C. In other embodiments, the angled oxygen ions 116 may be provided using a compact ion beam source, such as a plasma chamber equipped with an extraction plate, arranged to direct an angled oxygen beam to the substrate 101, as known in the art.

Turning to FIGS. 3A-3D, there is shown a subsequent instance where a block patterning is performed to form a mask 120, where the mask 120 covers PFET regions of the semiconductor device structure 100. The mask 120 may be formed by known lithographic techniques where the mask material is an optical proximity layer, for example. As shown in FIG. 3C, the mask 120 may be shifted so as to not completely cover the first nanowire stack 115. This shifting ensures the trench 124 is fully exposed.

Turning to FIGS. 4A-4D, there is shown a subsequent instance where a vertical etch is performed to selectively remove the first work function metal 114 between the first nanowire stack 115 and the second nanowire stack 117. As shown, the mask 120 is in place. In this manner, a directional reactive ion etch may be performed, shown by ions 122, where the ions are directed along the Z-axis so as to reach the bottom 121 of trench 124. The ions 122 may be provided in a known reactive ion etch mixture used to selectively etch the first work function metal 114 with respect to the oxide layer 118. For example, etch chemistry to selectively etch TiN with respect to titanium dioxide, such as Cl2-based plasmas, is known. Thus, the oxide layer 118 acts as a hard mask for the reactive ion etching operation shown. Because the trench 124 is fully exposed, the ions 122 serve as a self-aligned reactive ion etch, where any exposed regions of the first work function metal 114, impacted by the ions 122, may be etched, while exposed regions of the oxide layer 118 are not etched, or are etched to a lesser extent. As such, the first work function metal 114 may be removed from the bottom 121 of trench 124, while the oxide layer 118 is preserved, at least in part, in the top regions 119. Accordingly, the first work function metal 114 is preserved in the PFET regions, covered by the oxide layer 118 or mask 120, including the first nanowire stack 115 (as is also preserved in the NFET regions, second nanowire stack 117), while being removed from the region between nanowire stacks. The removal of the first work function metal at the bottom 121 of trench 124 exposes the subjacent layer, meaning the gate dielectric 112, between the first nanowire stack 115 and the second nanowire stack 117. Subsequently to the operations of FIG. 4A, FIGS. 5A-5D illustrate an instance where the mask 120 is selectively removed, such as using a known wet or dry etchant or solvent. Subsequently to the operation of FIGS. 5A-5D, FIGS. 6A-6D illustrate an optional operation where the oxide layer 118 is selectively removed. Subsequently to the operation of FIGS. 6A-6D, FIGS. 7A-7D illustrate an operation where a second block pattern operation is performed to protect first polarity regions of the CMOS nanosheet device structure, after the performing the vertical etch. Said differently, the PMOS region is protected by forming a mask 130, where open areas of the mask 130 are formed to expose NFET areas.

Subsequently to the operation of FIGS. 7A-7D, FIGS. 8A-8D illustrate an operation where the first work function metal 114 is removed from areas not protected by the mask 130, namely NFET regions. A known etch may be performed to selectively remove the first work function metal 114 in an isotropic manner. The etchant used may etch TiN in one embodiment, while not etching the gate dielectric 112. As such, the second nanowire stack 117 where NFET devices are to be formed no longer is coated with the first work function metal 114.

Figure 10A:
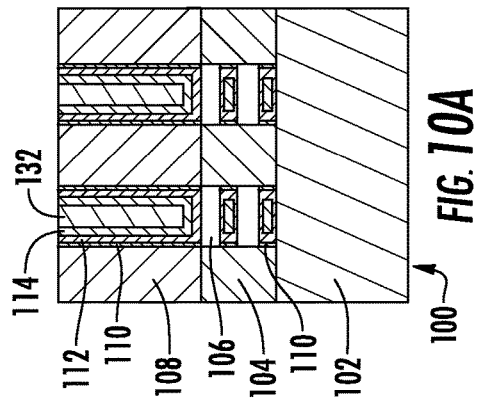
FIG. 10A to FIG. 10D depict respective side cross-sectional views of the semiconductor device structure of FIG. 1A to FIG. 1D, at another stage of fabrication.
Figure 10B:
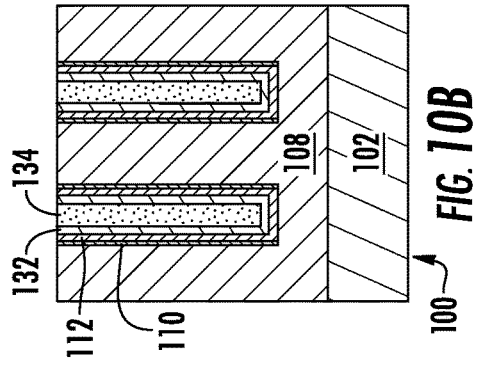
Figure 10C:
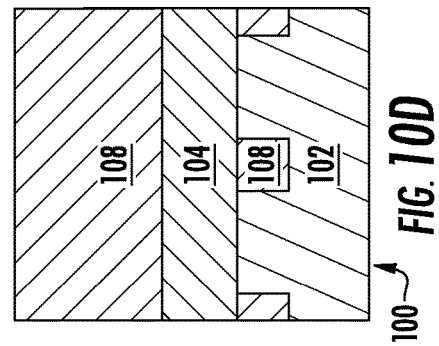
Figure 10D:
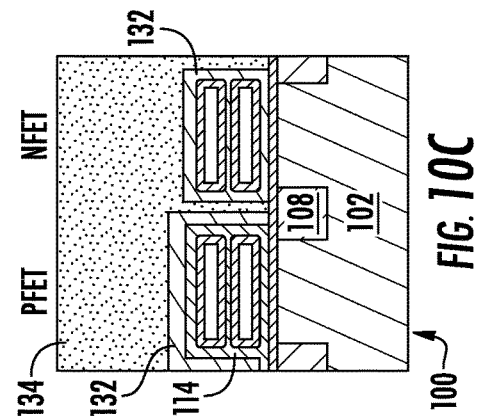

Subsequently to the operation of FIGS. 8A-8D, FIGS. 9A-9D illustrate an instance where the mask 130 is selectively removed, such as using a known wet or dry etchant or solvent. Subsequently to the operation of FIGS. 9A-9D, FIGS. 10A-10D illustrate an instance after a second work function metal 132 is deposited, followed by deposition of a gate conductor 134. The second work function metal 132 may be a known N-type work function metal. In one non-limiting embodiment the N-type work function metal may be TiAlC or other known N-type work function metal. In various embodiments, the gate conductor 134 may be tungsten metal. After deposition, the gate conductor 134 may be planarized, such as using a chemical mechanical polishing operation, as shown in FIG. 10B. As such, an appropriate work function metal now surrounds the first nanowire stack 115 (PFET) and the second nanowire stack 117 (NFET). Subsequently to the operation of FIGS. 10A-10D, FIGS. 11A-11D illustrate a subsequent instance after a capping layer 136 has been deposited, such as silicon nitride.

Table I illustrates a reference flow where the angled oxidation of the present embodiments is not performed, as well as a flow using angled oxidation. The operations listed in rows 1-9 are comparable to one another or are the same, where such operations are known in the art. The flow in each case includes nanosheet stack (NS) patterning, shallow trench oxidation (STI) filling, dummy gate patterning, as well as recess of the patterned nanosheets, and inner spacer formation. Notably, the nanosheet stacks may be a series of alternating layers of silicon and SiGe as known in the art. Subsequently, a source/drain epitaxial growth process is performed, followed by removal of dummy gate material, such as polysilicon. Subsequently, SiGe sheets are selectively removed from the nanosheet stacks, leaving isolated nanowires, such as silicon nanowires. The isolated nanowires are then coated with a gate oxide or gate dielectric and first work function metal, both in NFET and PFET regions.

A difference in the flow emerges in the operations shown in rows 10-13, just used in the angled oxidation flow. In the angled oxidation flow angled $O_2$ implantation may be directed to the nanosheet stacks as discussed above, followed by a first block patterning operation, and vertical reactive ion etching to remove first work function metal from the bottom of trenches between nanosheet stacks, and second block patterning as described above. The reference flow uses just one block patterning operation at row 14, while the operations of rows 15-17 are similar (not identical) to one another in both flows.

TABLE I

|    | Reference Flow | Angled Oxidation Flow |
|----|---|---|
| 1  | NS patterning | NS patterning |
| 2  | STI | STI |
| 3  | Dummy gate patterning | Dummy gate patterning |
| 4  | NS recess | NS recess |
| 5  | Inner spacer formation | Inner spacer formation |
| 6  | S/D Epi | S/D Epi |
| 7  | Poly Si pull | Poly Si pull |
| 8  | SiGe sheet removal | SiGe sheet removal |
| 9  | Gate oxide/first WF metal dep | Gate oxide/first WF metal dep |
| 10 |  | Angled O2 implantation |
| 11 |  | Block pattern 1 |
| 12 |  | RIE to disconnect bottom first WF metal |
| 13 |  | Block pattern 2 |
| 14 | Block pattern |  |
| 15 | First WF metal removal | Protected First WF metal removal |
| 16 | Second WF and gate metal dep | Second WF and gate metal dep |
| 17 | Capping SiN formation | Capping SiN formation |

An advantage of the angled oxidation flow may be highlighted by consideration of a side effect of the reference flow, as illustrated in FIG. 8E and FIG. 8F. The FIG. 8F is meant to illustrate the resulting structure when the operation shown in FIGS. 8A-8D (row 15 of table I.) is performed using the reference flow, where no angled oxidation is performed. Thus, in the example of FIG. 8E, no oxide layer hard mask has been formed, where the oxide layer hard mask (oxide layer 118) facilitates the selective removal of the first work function metal 114 from the bottom of trench 124 as shown in FIG. 4C, discussed above. Because the first work function metal 114 remains in place in the bottom of trench 124, a subsequent process to remove the first work function metal 114 (such as TiN) from the NFET regions may inadvertently attack the PFET nanosheet stack, meaning first nanowire stack 115. This inadvertent damage is illustrated in FIG. 8F, showing the resulting structure after an etch 150 is performed to remove first work function metal 114 from the NFET region. Notably, the etch 150 may be an isotropic etch configured to remove first work function metal 114 from all surfaces, given the three-dimensional nature of the nanosheet stacks. As shown in FIG. 8E, a mask 140 is formed over the first nanowire stack 115, while the second nanosheet stack is exposed, to allow removal of the first work function metal 114 from the NFET region. Notably, because of the presence of the first work function metal 114 at the bottom of trench 124, the mask 140 does not extend down to the gate dielectric 112. Accordingly, when exposed to an isotropic etchant to remove the first work function metal 114, the isotropic etchant may attack under the mask 140, generating the exposed nanosheet regions 142. These exposed regions, bereft of work function metal, may cause failure of the PFET transistors to be formed. With reference again to FIG. 4C, the angled oxidation flow, by removing the first work function metal 114 at the bottom of trench 124, permits the mask 130 to contact the gate dielectric 112, and to block any path of etchant to the first work function metal 114 in the PFET region, as shown.

Figure 12:
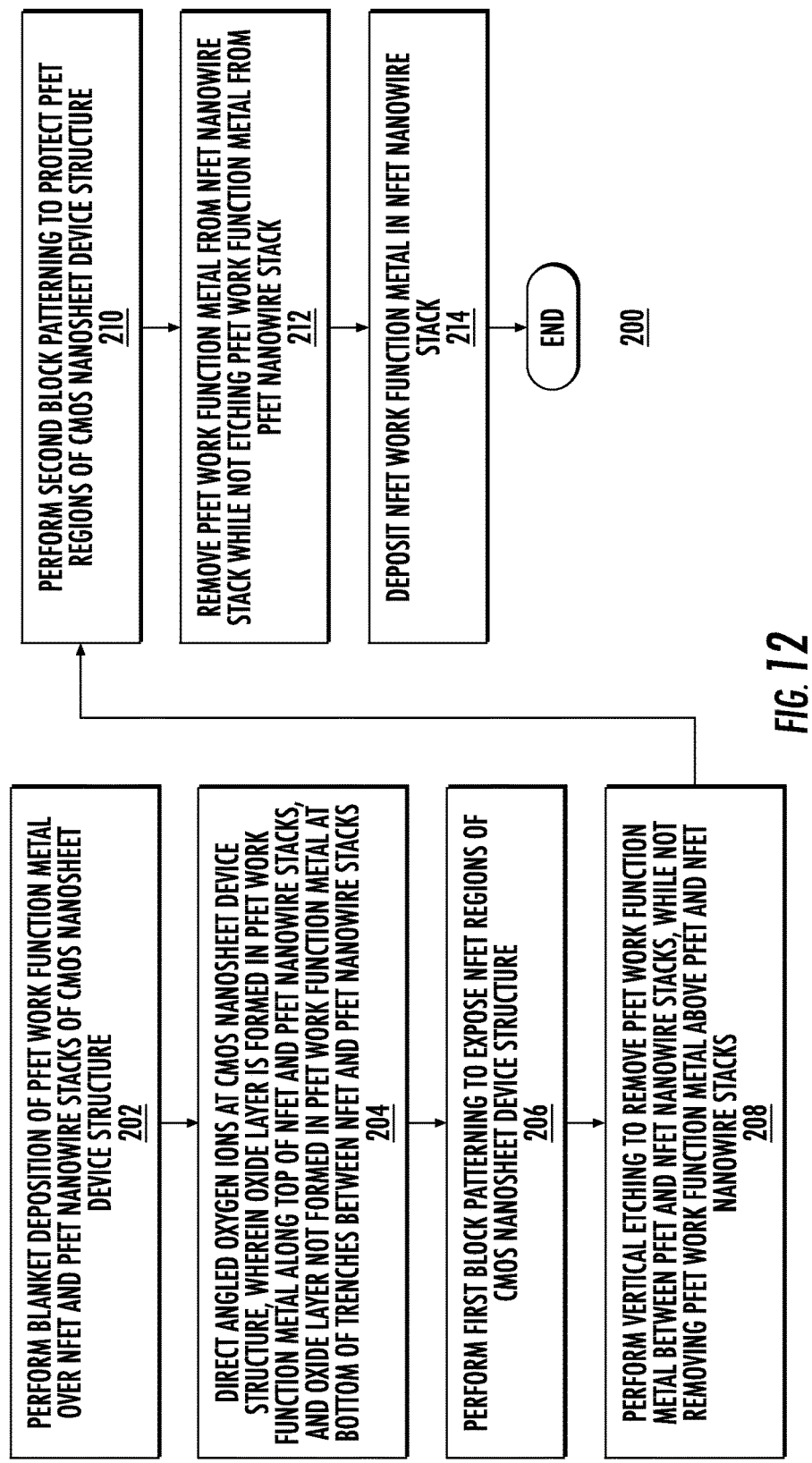
FIG. 12 illustrates an exemplary process flow, according to embodiment of the disclosure.

FIG. 12 depicts an exemplary process flow 200, according to embodiments of the disclosure. At block 202, a blanket deposition of a PFET work function metal is performed over NFET and PFET nanowire stacks of a CMOS nanosheet device structure. The PFET work function metal may be TiN, such as a TIN layer, according to some embodiments. As such, both PFET nanowire stacks and NFET nanowire stacks may be coated with the PFET work function metal At block 204, angled oxygen ions are directed at the CMOS nanosheet device structure, wherein an oxide layer is formed in the PFET work function metal along tops of the NFET nanowire stack and PFET nanowire stack. The oxide layer may extend through an entire thickness of the (former) PFET work function metal, or may form in a top portion of the PFET work function metal. In various non-limiting embodiments, a thickness of the oxide layer may range between 1 nm and 4 nm. At the same time, by virtue of the angle of incidence of the angled oxygen ions, an oxide layer is not formed in the PFET work function metal at the bottom of trenches between the NFET nanowire stack and PFET nanowire stack.

At block 206, a first block patterning operation is performed to expose NFET regions of the CMOS nanosheet device structure. The block patterning may be performed wherein the covered portions of a mask are shifted to partially expose PFET nanosheet stacks, to ensure trench regions between PFET nanosheet stacks and adjacent NFET nanosheet stacks are exposed.

At block 208, a vertical etching operation is performed to remove the PFET work function metal between PFET and NFET nanowire stacks, while not removing PFET work function metal above the PFET nanowire stacks and NFET nanowire stacks. The vertical etching may involve directional reactive ion etching to selectively remove the PFET work function metal, such as TiN, while the oxide layer such as TiO$_2$, remains in place, acting as a hard mask to protect subjacent regions. As such, the vertical etching may constitute a self-aligned etch process, etching just device regions such as trenches, where subjacent device structures, including the PFET work function metal is not covered by an oxide layer. As such, a gate dielectric in the bottom of the trenches may be exposed.

At block 210, a second block patterning operation is performed to protect PFET regions of the CMOs nanosheet device structure, such as PFET nanowire stacks where transistors are formed. The second block patterning operation may entail forming a mask covering the PFET nanowire stacks and extends over a portion of a trench between a PFET nanowire stack and adjacent NFET nanowire stack. Accordingly, the edge of the mask may extend to contact a gate dielectric in the trench.

At block 212, the PFET work function metal is removed from the NFET nanowire stack(s) while not etching the PFET work function metal from the PFET nanowire stack(s). The removal may be performed using an isotropic etch. As such, any PFET work function metal on the PFET nanowire stacks may be protected by the mask, wherein the isotropic etch does not attack the PFET nanowire stack.

At block 214, an NFET work function metal is deposited in the NFET nanowire stack, so as to form a proper NFET transistor gate.

The present embodiments provide various advantages over known HGAA device processes. For one advantage, the present approaches enable formation of dual work function metal CMOS devices in a nanosheet device structure. For another advantage, the present embodiments further provide simplified self-aligned processes for achieving dual work function metal gate structures for CMOS nanosheet devices.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a three-dimensional transistor device, comprising:
   performing a first blanket deposition of a first work function metal over a first nanowire stack, having a first polarity, and over a second nanowire stack having a second polarity, in a complementary metal oxide semiconductor (CMOS) nanosheet device structure, disposed on a substrate;
   directing angled oxygen ions at the CMOS nanosheet device structure, wherein an oxide is formed in the first work function metal along a top region of the first nanowire stack and the second nanowire stack, and wherein an oxide layer is not formed in the first work function metal at a bottom of a trench between the first nanowire stack and the second nanowire stack; and
   performing a vertical etch to selectively remove the first work function metal between the first nanowire stack and the second nanowire stack.

2. The method of claim 1, wherein the vertical etch comprises a reactive ion etching operation, wherein the first work function metal is a TiN layer, wherein the oxide layer comprises titanium dioxide, and wherein the reactive ion etching operation selectively etches the TiN layer with respect to the titanium dioxide.

3. The method of claim 1, further comprising:
   performing a first block patterning operation to expose second polarity regions in the CMOS nanosheet device structure, before the direction the performing the vertical etch.

4. The method of claim 3, further comprising:
   performing a second block patterning operation to protect first polarity regions of the CMOS nanosheet device structure, after the performing the vertical etch; and
   removing the first work function metal from the second nanowire stack while not etching the first work function metal from the first nanowire stack.

5. The method of claim 4, further comprising:
   after the removing the first work function metal, performing a second blanket deposition of a second work function metal over the first nanowire stack and the second nanowire stack.

6. The method of claim 1, wherein the angled oxygen ions form a non-zero angle of incidence with respect to a perpendicular to a plane of the substrate.

7. The method of claim 6, wherein a value of the non-zero angle of incidence ranges between 10 degrees and 80 degrees.

8. The method of claim 1, wherein a dose of the angled oxygen ions ranges from $1E16/cm^2$ to $2E17/cm^2$.

9. The method of claim 1, wherein an energy of the angled oxygen ions is 2 keV or less.

10. The method of claim 1, wherein a thickness of the oxide layer is 1 nm to 4 nm.

11. A method of forming a three-dimensional transistor device, comprising;
   performing a first blanket deposition of a P-type work function metal over a P-type nanowire stack and over an N-type nanowire stack, in a complementary metal oxide semiconductor (CMOS) nanosheet device structure, disposed on a substrate;
   directing angled oxygen ions at the CMOS nanosheet device structure, wherein an oxide is formed in the P-type work function metal along a top region of the P-type nanowire stack and the N-type nanowire stack, and wherein an oxide is not formed in the P-type work function metal at a bottom of a trench between the P-type nanowire stack and the P-type nanowire stack; and
   performing a vertical etch to remove the P-type work function metal between the P-type nanowire stack and the N-type nanowire stack, while not removing the P-type work function metal above the P-type nanowire stack and the N-type nanowire stack.

12. The method of claim 11, wherein the vertical etch comprises a reactive ion etching operation, wherein the P-type work function metal is a TiN layer, wherein the oxide is titanium dioxide, and wherein the reactive ion etching operation selectively etches the TiN layer with respect to the titanium dioxide.

13. The method of claim 11, further comprising:
   performing a first block patterning operation to expose N-type regions in the CMOS nanosheet device structure, before the performing the vertical etch.

14. The method of claim 13, further comprising:
   performing a second block patterning operation to protect P-type polarity regions of the CMOS nanosheet device structure, after the performing the vertical etch; and
   removing the P-type work function metal from the N-type nanowire stack while not etching the P-type work function metal from the P-type nanowire stack.

15. The method of claim 11, wherein the P-type nanowire stack and the N-type nanowire stack comprise a plurality of silicon nanowires, stacked in a vertical configuration, wherein the trench has an aspect ratio of 1 or greater, wherein a trench depth is greater than or equal to a trench width, defining a spacing between the P-type nanowire stack and the N-type nanowire stack.

16. A method of forming a three-dimensional transistor device, comprising;
   directing angled oxygen ions at a CMOS nanosheet device structure, comprising a titanium nitride layer disposed over a P-type nanowire stack and over an N-type nanowire stack, wherein titanium oxide is formed in the titanium nitride layer along a top region of the N-type nanowire stack and the P-type nanowire stack, and wherein the titanium oxide is not formed in the titanium nitride layer at a bottom of a trench between the P-type nanowire stack and the P-type nanowire stack;

performing a first block patterning operation to expose N-type polarity regions in the CMOS nanosheet device structure; and performing a vertical etch to selectively remove the titanium nitride layer between the P-type nanowire stack and the N-type nanowire stack, wherein the titanium oxide is not removed along the top region.

17. The method of claim 16, further comprising:

performing a first block patterning operation to expose the N-type polarity regions in the CMOS nanosheet device structure, before the performing the vertical etch.

18. The method of claim 17, further comprising:

performing a second block patterning operation to protect P-type regions of the CMOS nanosheet device structure, after the performing the vertical etch; and removing the titanium nitride layer from the N-type nanowire stack while not etching the titanium nitride layer from the P-type nanowire stack.

19. The method of claim 18, further comprising:

after the removing the titanium nitride layer, performing a second blanket deposition of an N-type work function metal over the P-type nanowire stack and the N-type nanowire stack.

\* \* \* \* \*